(12) United States Patent
Everitt

(10) Patent No.: US 6,580,587 B1
(45) Date of Patent: Jun. 17, 2003

(54) QUAD-LAYER GMR SANDWICH

(75) Inventor: Brenda A. Everitt, Minneapolis, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/787,050

(22) PCT Filed: Sep. 28, 1999

(86) PCT No.: PCT/US99/22356

§ 371 (c)(1),
(2), (4) Date: May 17, 2001

(87) PCT Pub. No.: WO00/19226

PCT Pub. Date: Apr. 6, 2000

Related U.S. Application Data

(60) Provisional application No. 60/102,188, filed on Sep. 28, 1998.

(51) Int. Cl.$^7$ .................................................. G11B 5/39
(52) U.S. Cl. .................... 360/324; 360/313; 360/316
(58) Field of Search .............................. 360/324, 324.1, 360/324.11, 324.12, 324.2, 313–316

(56) References Cited

U.S. PATENT DOCUMENTS

| | | | | |
|---|---|---|---|---|
| 5,563,760 A | * | 10/1996 | Lowis et al. ................ 361/103 |
| 6,111,403 A | * | 8/2000 | Yokotani et al. ........ 324/207.21 |
| 6,118,284 A | * | 9/2000 | Ghoshal et al. .............. 324/750 |
| 6,154,025 A | * | 11/2000 | Schelter et al. ........ 324/207.21 |
| 6,169,396 B1 | * | 1/2001 | Yokotani et al. ....... 324/207.21 |
| 6,175,296 B1 | * | 1/2001 | Tokunaga et al. ......... 338/32 R |
| 6,175,476 B1 | * | 1/2001 | Huai et al. ............. 360/324.11 |
| 6,191,926 B1 | * | 2/2001 | Everitt et al. .......... 360/324.11 |
| 6,239,595 B1 | * | 5/2001 | Shinjo et al. ................ 324/252 |
| 6,246,234 B1 | * | 6/2001 | Yokotani et al. ........ 324/207.21 |
| 6,271,997 B1 | * | 8/2001 | Gill .............................. 360/314 |
| 6,288,552 B1 | * | 9/2001 | Palmgren .................... 324/505 |
| 6,339,329 B1 | * | 1/2002 | Neumann et al. ........... 324/252 |
| 6,407,890 B1 | * | 6/2002 | Gill .............................. 360/314 |
| 6,424,506 B1 | * | 7/2002 | Saito et al. ............. 360/324.11 |
| 6,449,134 B1 | * | 9/2002 | Beach et al. ............ 360/324.12 |
| 6,496,004 B1 | * | 12/2002 | Nguyen Van Dau et al. .......................... 324/252 |
| 6,501,271 B1 | * | 12/2002 | Lenssen et al. ............. 324/252 |
| 6,504,688 B2 | * | 1/2003 | Hasegawa et al. ..... 360/324.11 |

FOREIGN PATENT DOCUMENTS

| | | |
|---|---|---|
| DE | 42 43 358 | 6/1994 |
| EP | 687 917 | 12/1995 |
| EP | 807 827 | 11/1997 |

* cited by examiner

Primary Examiner—Jefferson Evans
(74) Attorney, Agent, or Firm—Merchant & Gould P.C.

(57) ABSTRACT

A magnetoresistive (GMR) sensor includes a substrate and a first trilayer disposed on the substrate. A first spacer layer is disposed on the first trilayer. A first magnetic layer is disposed on the first spacer. A second spacer layer is disposed on the first magnetic layer. A second magnetic layer is disposed on the second spacer layer. A third spacer layer is disposed on the second magnetic layer. A second trilayer is disposed on the third spacer layer and a cap layer is disposed on the second trilayer. The first and second trilayers include, a first ferromagnetic layer, a second ferromagnetic layer and an anti-parallel coupling layer disposed between and in contact with the first and second ferromagnetic layers.

30 Claims, 6 Drawing Sheets

FIG. 1A
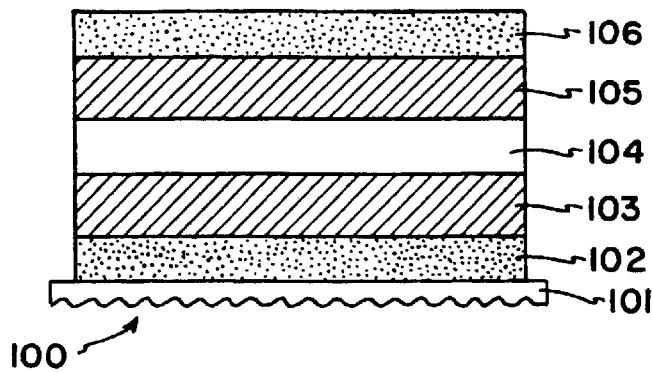
FIG. 1B
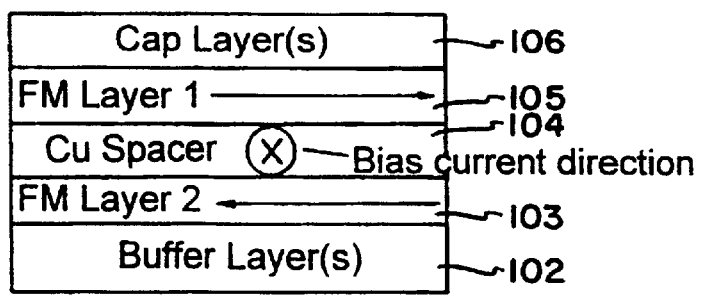
FIG. 1C
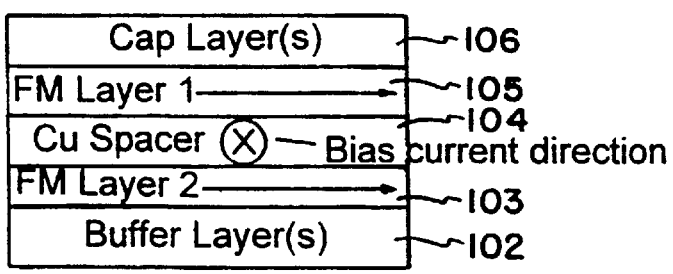

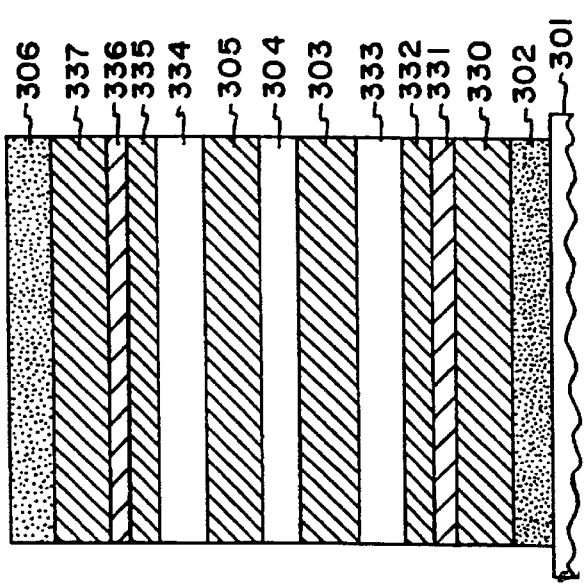
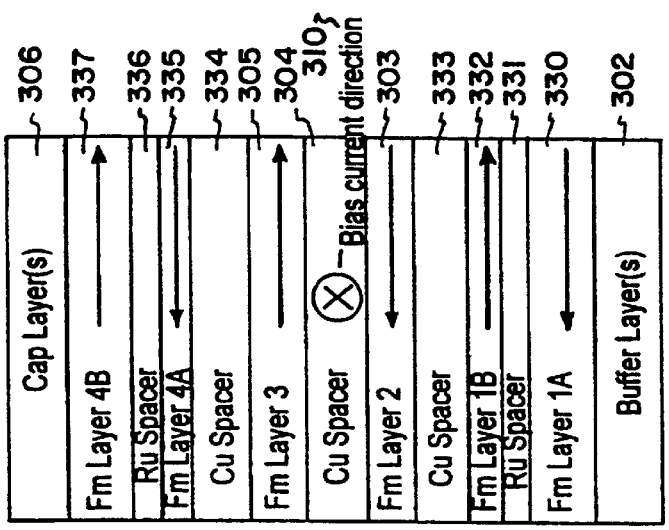
FIG. 3A
FIG. 3B
FIG. 3C

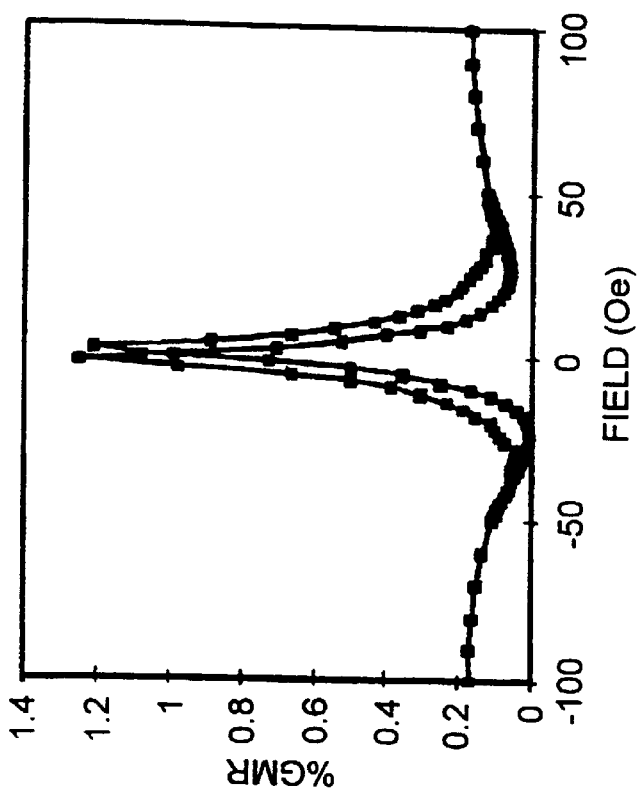
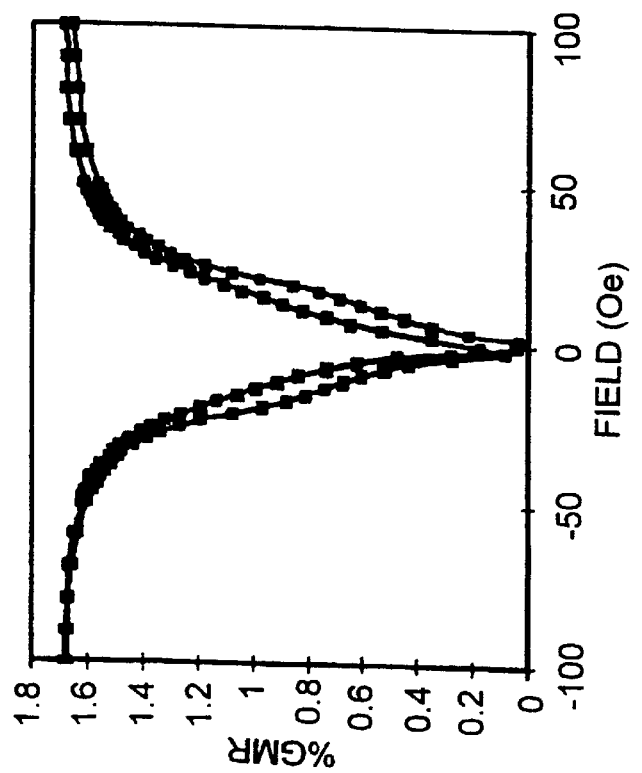

QUAD-LAYER GMR SANDWICH

This application claims the benefit of and is a continuation-in-part of the provisional application serial No. 60/102,188, entitled "Quad-Layer GMR Sandwich," filed Sep. 28, 1998 which is incorporated herein.

FIELD OF THE INVENTION

This invention relates generally to a novel structure for a giant magnetoresistance sensor suitable for high density data applications and to systems which incorporate such sensors. In addition, this invention finds utility in any other application in which magnetic field sensing is desired.

BACKGROUND OF THE INVENTION

Computers often include auxiliary memory storage devices having media on which data can be written and from which data can be read for later use. A direct access storage device (disc drive) incorporating rotating magnetic discs is commonly used for storing data in magnetic form on the disc surfaces. Data are recorded on concentric, radially spaced tracks on the disc surfaces. Magnetic heads including read sensors are then used to read data from the tracks on the disc surfaces.

In high capacity disc drives, magnetoresistive read sensors, commonly referred to as MR heads, are the prevailing read sensors because of their ability to read data from a surface of a disc at greater linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flow through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a nonmagnetic layer or layers (spacer) and the accompanying spin-dependent scattering which takes place at the interface of the magnetic and non-magnetic layers and within the magnetic layers.

FIG. 1(a) illustrates a simple, unpinned GMR sensor 100. The simple GMR sensor consists of two magnetic layers 103 and 105 separated by a nonmagnetic spacer 104. A cap layer 106 covers one magnetic layer 105 and a buffer layer 102 is disposed under the other magnetic layer 103. The entire structure is deposited on a substrate 101. This simple unpinned GMR sensor 100 provides a limited GMR resulting in a relatively weak signal.

FIG. 1(b) illustrates the magnetization directions of the simple unpinned GMR sensor 100 with a bias current 110 flowing into the page. With current bias 110 the magnetization directions of the magnetic layers 105 and 103 are oriented mainly anti-parallel to each other as shown by the arrows.

FIG. 1(c) illustrates the magnetization directions of the simple unpinned GMR sensor 100 with a bias current 110 flowing into the page and an external magnetic field 111 applied. When a large enough external field 111 is applied, magnetization of the magnetic layers 105 and 103 will align with the field direction and the resistance will be low.

The sensors shown in FIGS. 1(a)–(c) are useful for applications such as magnetic field sensing. Simple unpinned GMR sensors have been used in bridge circuits, however, to operate successfully, i.e., provide a differential in resistance, one set of simple, unpinned GMR sensors must be either shielded or additionally biased. This additional shielding or biasing adds additional cost and complexity to the bridge circuit.

Therefore, there is a need for a magnetoresistive sensor that provides an increased GMR, resulting in a higher signal output. Also, there is a need for sensors that provide different field responses based on the current density applied to the sensor without requiring the additional complexity of shielding or biasing.

SUMMARY OF THE INVENTION

According to a first aspect of the present invention there is provided a magnetoresitive (GMR) sensor including a substrate and a first trilayer disposed on the substrate. A first spacer layer is disposed on the first trilayer. A first magnetic layer is disposed on the first spacer. A second spacer layer is disposed on the first magnetic layer. A second magnetic layer is disposed on the second spacer layer. A third spacer layer is disposed on the second magnetic layer. A second trilayer is disposed on the third spacer layer and a cap layer is disposed on the second trilayer. The first and second trilayers include, a first ferromagnetic layer, a second ferromagnetic layer and an anti-parallel coupling layer disposed between and in contact with the first and second ferromagnetic layers.

According to another aspect of the present invention there is provided a magnetoresistive sensor device including a substrate and a first trilayer disposed on the substrate. A first spacer layer is disposed on the first trilayer. A first magnetic layer is disposed on the first spacer. A second spacer layer is disposed on the first magnetic layer. A second magnetic layer is disposed on the second spacer layer. A third spacer layer is disposed on the second magnetic layer. A second trilayer is disposed on the third spacer layer and a cap layer is disposed on the second trilayer. The first and second trilayers include, a first ferromagnetic layer, a second ferromagnetic layer and an anti-parallel coupling layer disposed between and in contact with the first and second ferromagnetic layers. The resistance of the magnetoresistive sensor is dependent on the magnitude of an applied bias current.

According to another aspect of the present invention there is provided a bridge circuit including a first pair of magnetoresistive structures coupled to first opposite nodes of a Wheatstone bridge and a second pair of magnetoresistive structures coupled to second opposite nodes of the Wheatstone bridge The first pair of magnetoresistive structures has a greater current density than the second pair of magnetoresistive structures when an external field is applied to the Wheatstone bridge.

According to another aspect of the present invention there is provided a disc drive system including a magnetic recording disc, a magnetoresitive sensor, an actuator for moving the magnetoresitive sensor across the magnetic recording disc and a detection circuitry electrically coupled to the magnetoresitive sensor for detecting changes in resistance of the magnetoresitive sensor caused by rotation of the magnetization axes of the first and second laminate layers in response to magnetic fields from the magnetically recorded data. The magnetoresistive sensor includes a substrate and a first trilayer disposed on the substrate. A first spacer layer is disposed on the first trilayer. A first magnetic layer is disposed on the first spacer. A second spacer layer is disposed on the first magnetic layer. A second magnetic layer is disposed on the second spacer layer. A third spacer layer is disposed on the second magnetic layer. A second trilayer is disposed on the third spacer layer and a cap layer is disposed on the second trilayer. The first and second trilayers include, a first ferromagnetic layer, a second ferromagnetic layer and an anti-parallel coupling layer disposed between and in contact with the first and second ferromagnetic layers.

According to another aspect of the present invention there is provided a an apparatus for measuring an external field applied across a Wheatstone bridge. The apparatus includes a four terminal electrical network (A, B, C, D) including a first resistor $R_1$ connected between network terminals (A) and (B), a second resistor $R_2$ connected between terminals (B) and (C), a third resistor $R_3$ connected between the network terminals (C) and (D) and a fourth resistor $R_4$ being connected across network terminals (A) and (D). The resistors $R_1$ and $R_3$ have a first current density when a field is applied across network terminals (A) and (C) and the resistors $R_2$ and $R_4$ have a second current density when the same field is applied across network terminals (A) and (C). The second current density is not equal to the first current density. The apparatus also includes means operatively coupled across the network terminals (B) and (D) for detecting a potential across the terminals (B) and (D).

The above, as well as additional objects, features, and advantages of the present invention will become apparent in the following detailed written description.

BRIEF DESCRIPTION OF THE DRAWINGS

For a fuller understanding of the nature and advantages of the present invention, as well as the preferred mode of use, reference should be made to the following detailed description read in conjunction with the accompanying drawings. In the following drawings, like reference numerals designate like or similar parts throughout the drawings.

FIG. 1(a) is a cross-sectional view, not to scale, of a simple GMR sensor.

FIG. 1(b) is a cross section view of the sensor shown in FIG 1(a) with bias current flowing into the page.

FIG. 1(c) is a cross section view of the sensor shown in FIG. 1(a) biased in low resistance state.

FIG. 3(a) is a cross-sectional view, not to scale, of a GMR sensor according to a preferred embodiment of the present invention.

FIG. 3(b) is a cross-sectional view, not to scale, of the GMR sensor shown in FIG. 3(a) biased in the high resistance state.

FIG. 3(c) is a cross-sectional view, not to scale, of the GMR sensor shown in FIG. 3(a) biased in the low resistance state.

FIG. 4(a) is the transfer curve (%GMR versus applied magnetic field) for an GMR sensor according to the present invention with a low bias current.

FIG. 4(b) is a the transfer curve (%GMR versus applied magnetic field) for an GMR sensor according to the present invention with a high bias current.

DETAILED DESCRIPTION OF THE PRESENTLY PREFERRED EMBODIMENTS

The following description is a detailed description of the preferred embodiments presently contemplated for carrying out the present invention. This description is made for the purpose of illustrating the general principles of the present invention and is not meant to limit the inventive concepts claimed herein.

Figure 2:
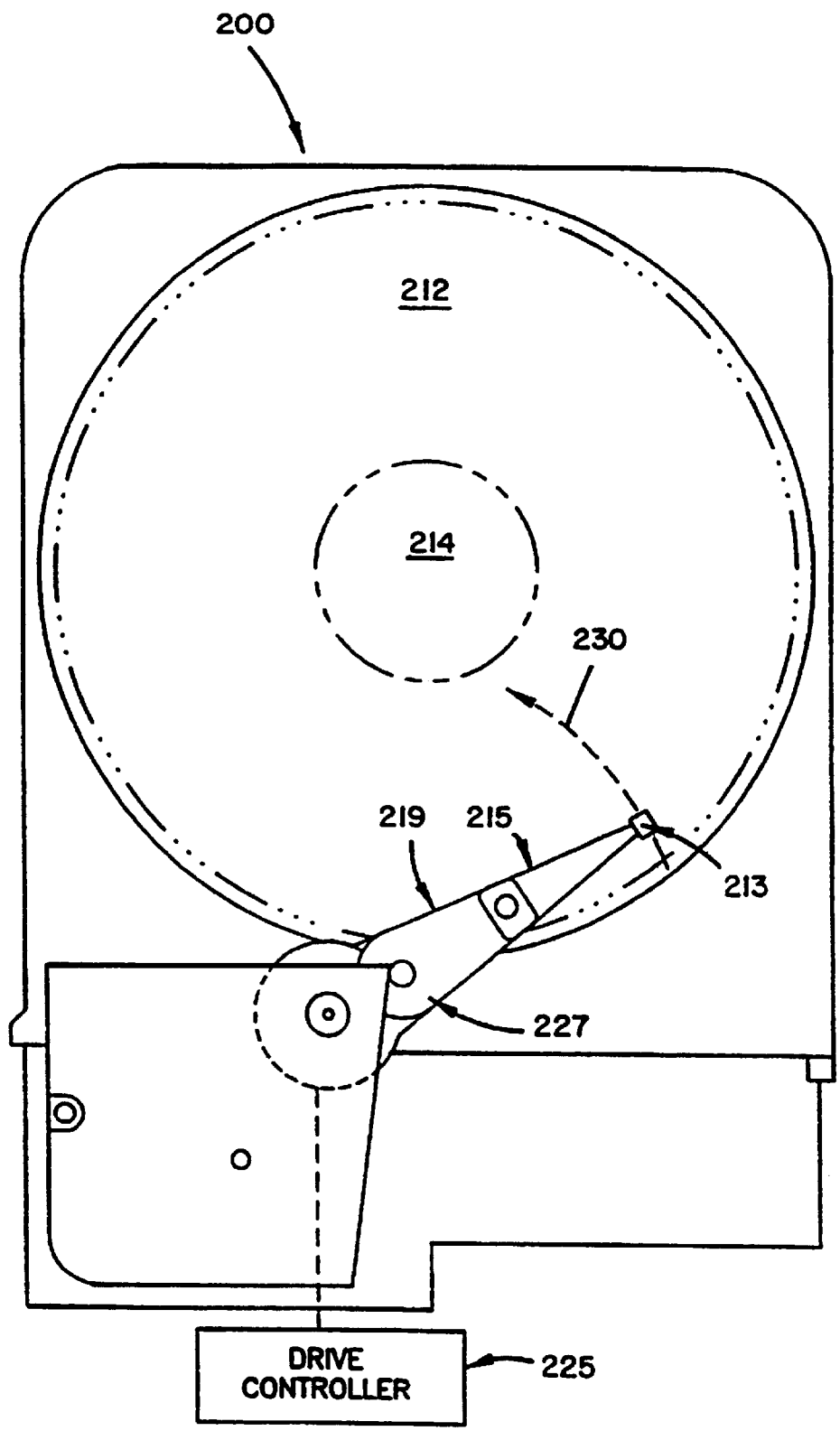
FIG. 2 is a simplified drawing of a magnetic recording disc drive system.

FIG. 2 shows a disc drive system 200 embodying the present invention. As shown in FIG. 2, at least one rotatable magnetic disc 212 is supported on a spindle 214 and rotated by a disc drive motor. The magnetic recording media on each disc is in the form of an annular pattern of concentric data tracks (not shown) on disc 212.

At least one slider 213 is positioned on the disc 212, each slider 213 supporting one or more magnetic read/write heads where the head incorporates the GMR sensor of the present invention. As the discs rotate, slider 213 is moved radially in and out 230 over disc surface so that heads may access different portions of the disc where desired data is recorded. Each slider 213 is attached to an actuator arm 219 by means of a suspension 215. The suspension 215 provides a slight spring force which biases slider against the disc surface. Each actuator arm is attached to an actuator 227.

During operation of the disc storage system, the rotation of disc 212 generates an air bearing between an air bearing surface on the slider 213 (the surface of slider 212 which includes a reading head and faces the surface of disc is referred to as an air bearing surface (ABS)) and disc surface which exerts an upward force or lift on the slider 213. The air bearing thus counter-balances the slight spring force of suspension 215 and supports slider slightly above the disc 212 surface by a small, substantially constant spacing during normal operation.

The various components of the disc storage system are controlled in operation by control signals generated by control unit 229, such as access control signals and internal clock signals. Typically, control unit 229 includes logic control circuits, storage and a microprocessor. The control unit generates control signals to control various system operations such as drive motor control signals on line and head position and seek control signals on line. The control signals on line provide the desired current profiles to optimally move and position slider 213 to the desired data track on disc 212.

The above description of a typical magnetic disc storage system, and the accompanying illustration of FIG. 2 are for representation purposes only. It should be apparent that disc storage systems may contain a large number of discs and actuators, and each actuator may support a number of sliders.

FIG. 3(a) shows a cross-sectional view of a GMR structure 100 according to a preferred embodiment of the present invention. The layers of the GMR structure 100 are formed by using a number of techniques including, for example, sputter deposition, ion beam deposition and the like.

The GMR structure is typically formed on a substrate 301. The substrate 301 can be any suitable substance, including glass, semiconductor material, or a ceramic material. For disc drive applications, the substrate 301 may also include a permeable, bottom shield layer (not shown) and a half gap insulator (not shown). A buffer layer 302 is formed on the substrate. The buffer layer 302 is deposited to modify the crystallographic texture or grain size of the subsequent layers, and may not be needed depending on the substrate 301. If used, the buffer layer 302 may be formed of tantalum (Ta), zirconium (Zr), nickel-iron (Ni—Fe), or $Al_2O_3$. The buffer layer 302 is preferably about 20 to 80 Angstroms thick and more preferably has a thickness of about 35 Angstroms.

A first trilayer 320 is formed on the buffer layer 302 or substrate 301 if no buffer layer is used. The first trilayer 320 consists of a first ferromagnetic layer 332 and a second ferromagnetic layer 330 separated by an anti-parallel coupling (APC) layer 331.

The second ferromagnetic layer 330 may be formed of nickel-iron, cobalt-iron, nickel-iron-cobalt, and the like materials. The second ferromagnetic layer 330 is formed on the buffer layer 302 or the substrate 301. The second ferromagnetic layer 330 preferably has a thickness of about 10 to 100 Angstroms and, more preferably has a thickness of about 17 Angstroms.

The first ferromagnetic layer 332 may be formed of nickel-iron, cobalt-iron, nickel-iron-cobalt, and the like materials. The first ferromagnetic layer 332 is formed on the APC layer and is in contact with the spacer 331. The first ferromagnetic layer 332 preferably has a thickness of about 10 to 100 Angstroms and, more preferably has a thickness of about 35 Angstroms.

The APC layer 331 allows the two ferromagnetic layers 330 and 332 to be strongly coupled together magnetically in an anti-parallel orientation as shown by the arrows in FIG. 3(b). The APC layer 331 may be formed of ruthenium (Ru), indium and/or rhodium. The APC layer 331 preferably has a thickness of about 3 to 12 Angstroms, and more preferably has a thickness of 9.5 Angstroms.

Typically, the second ferromagnetic layer 330 has a larger magnetic moment than the first ferromagnetic layer 332. This can be accomplished by depositing a thicker layer of the second ferromagnetic layer 330 than the first ferromagnetic layer 332. Alternatively, it may be possible to increase the magnetic moment of a layer through material selection only.

A first spacer layer 333 is formed on the first trilayer 320. The first spacer layer 333 is thus formed on and in contact with the first ferromagnetic layer 332. The spacer 333 may be formed of a copper (Cu), gold (Au), silver (Ag) and the like. The first spacer layer 333 preferably has a thickness of about 25 to 45 Angstroms and, more preferably, has a thickness of 32 Angstroms.

A simple GMR structure 322 is formed on the first spacer layer 333. The simple GMR structure 322 consists of two magnetic layers 303 and 305 separated by a nonmagnetic (second) spacer layer 304. The magnetic layers 303 and 305 may be formed of nickel-iron, cobalt-iron, nickel-iron-cobalt, and the like materials. The magnetic layers 332 and 305 preferably have a thickness of about 10 to 100 Angstroms and, more preferably have a thickness of about 35 Angstroms. The nonmagnetic spacer 304 is formed on and in contact with a first magnetic layer 303. The nonmagnetic spacer 304 may be formed of a copper (Cu), gold (Au), silver (Ag) and the like. The nonmagnetic spacer layer 303 preferably has a thickness of about 25 to 45 Angstroms and, more preferably, has a thickness of about 32 Angstroms. A second magnetic layer 305 is then formed on and in contact with the nonmagnetic spacer 303.

A third spacer layer 334 is formed on the simple GMR structure 322. The third spacer layer 334 is thus formed on and in contact with the simple GMR structure 322. The third spacer layer 334 may be formed of a copper (Cu), gold (Au), silver (Ag) and the like. The third spacer layer 334 preferably has a thickness of about 25 to 45 Angstroms and, more preferably, has a thickness of about 32 Angstroms.

A second trilayer 321 is formed on the second third layer 334. The second trilayer 321 consists of a first ferromagnetic layer 335 and a second ferromagnetic layer 337 separated by an anti-parallel coupling (APC) layer 336. The materials and dimensions of this trilayer structure are preferably the same as previously described with reference to the first trilayer 320.

A cap layer 306 may be formed of a suitable protective material such as tantalum (Ta), $Al_2O_3$ and the like. The cap layer 306 is deposited on the second trilayer 321 to protect the active layers from oxidation, corrosion and the like. The cap layer preferably has a thickness of about 20 to 80 Angstroms and, more preferably, has a thickness of about 35 Angstroms.

FIG. 3(b) shows a cross-sectional view of the GMR structure according to the present invention in the zero external field, high resistance state. FIG. 3(b) illustrates the relative magnetization directions with a bias current 310 directed perpendicular into the stack as shown. Increasing the number of layers increased the GMR of the film, resulting in higher output signal. It is useful to have the correct orientation of the outer magnetic layers as shown in FIG. 3(b). The outer ferromagnetic layers 330 and 337 have a higher moment than the inner ferromagnetic layers 335 and 332.

FIG. 3(c) shows a cross-sectional view of the GMR structure shown in FIG. 3(a) biased in a low resistance state. The middle ferromagnetic layers 335, 305, 303, 332 are aligned as shown by the arrows thereby giving the structure a low resistance state. These layers are aligned due to the small amount of parallel coupling that exists across the interfaces. The thicker, outer ferromagnetic layers are not aligned but they do not contribute to the low resistance of the structure since that is determined by the magnetic orientation of the layers across the spacer layers. A low resistance state may also be achieved when a large external field is applied to the structure.

FIG. 4(a) illustrates a graph of the transfer curve for a resistor patterned from the GMR structure according to the present invention. A low bias current, preferably 1 mA, was applied to the structure as shown in FIG. 3(c). FIG. 4(b) illustrates a graph of the transfer curve for a resistor patterned from the GMR structure according to the present invention. A high bias current, preferably 20 mA, was applied to the structure as in FIG. 3(b).

Figure 5B:
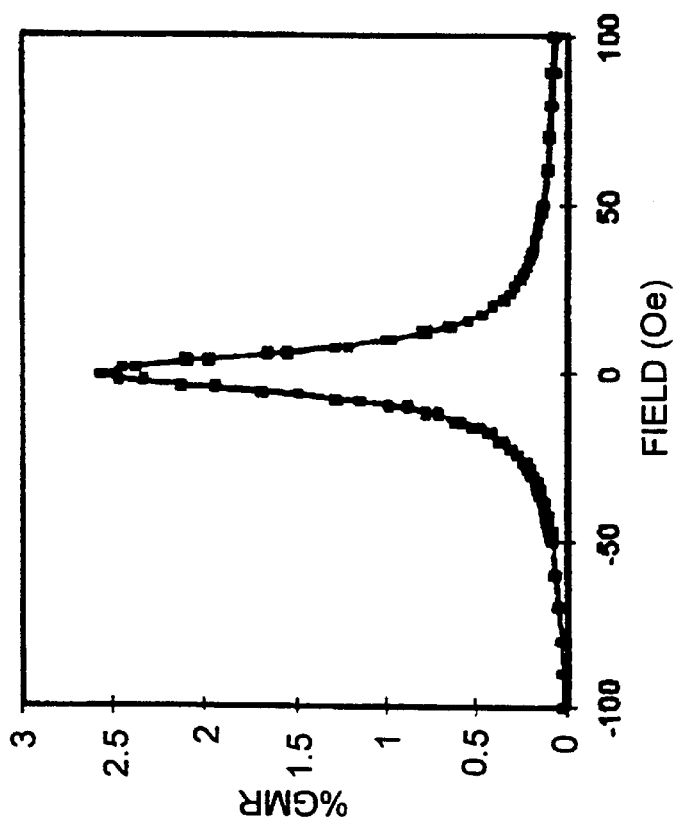
FIG. 5(b) is a comparison transfer curve (%GMR versus applied magnetic field) for a simple GMR sensor with a high bias current.
Figure 5A:
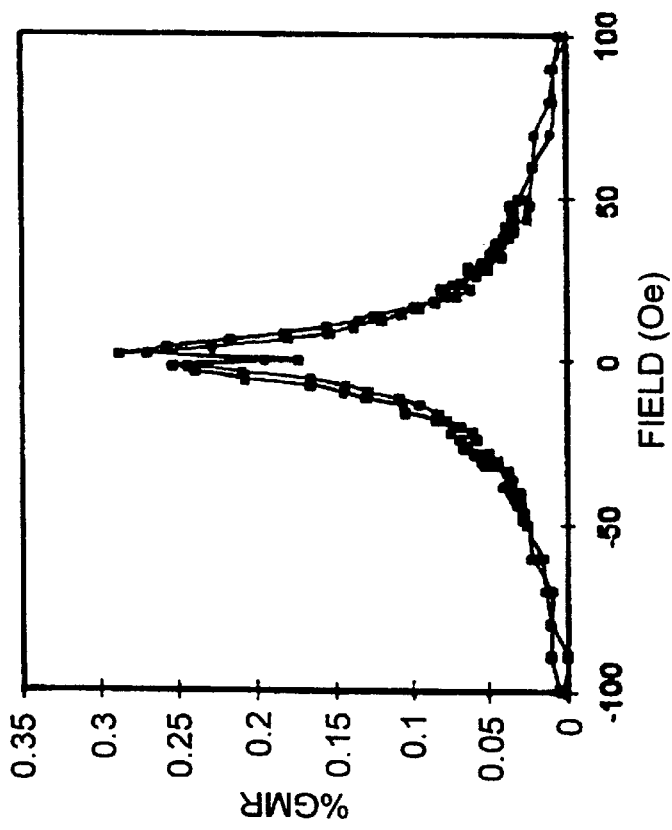
FIG. 5(a) is a comparison transfer curve (%GMR versus applied magnetic field) for a simple GMR sensor with a low bias current.

FIG. 5(a) illustrates a graph of the transfer curve for a resistor patterned from a simple GMR structure (FIG. 1(a)) with a 1 mA bias current applied to the structure as in FIG. 1(b). FIG. 5(b) illustrates a graph of the transfer curve for a resistor patterned from a simple GMR structure (FIG. 1(a)) with a 20 mA bias current was applied to the structure as in FIG. 1(b).

It can be seen from comparing the graphs of FIGS. 4(a)–(b) and FIGS. 5(a)–(b) that the transfer curve of the GMR structure according to the present invention is dependent upon the magnitude of the bias current applied to the structure. More particularly, the structure has a low resistance, zero external field state when a low bias current is applied and it has a high resistance, zero external field state when a high bias current is applied. The simple GMR structure shown always has a high resistance, zero external bias field no matter what bias current is applied.

Field Sensors

Figure 6:
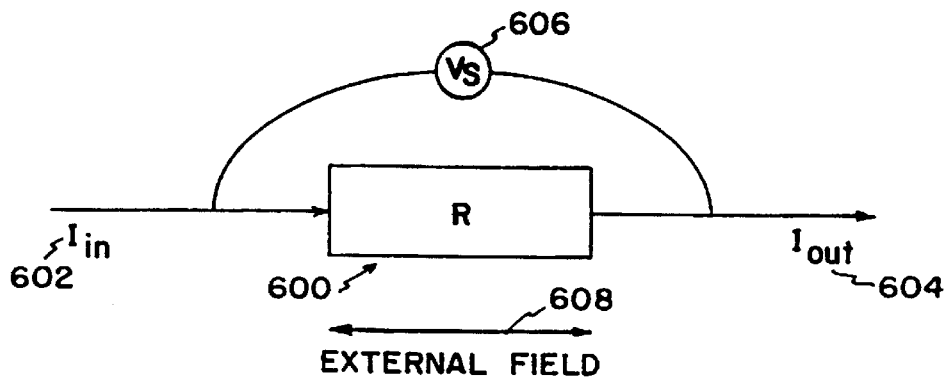
FIG. 6 is a simplified drawing of a GMR sensor according to the present invention.

FIG. 6 shows a field sensor according to a preferred embodiment of the present invention. The sensor 600 is formed as a GMR structure according to the present invention as already described. If a constant current $I_{in}$ 602 is applied to the sensor, a constant current $I_{out}$ 604 results. So, for example, if $I_{in}$ is a small current so is $I_{out}$. For $I_{insmall}$ the potential difference across the sensor 606 is measured and it is constant. If an external field 608 is then applied, the resistance of the sensor 600 changes thereby causing a change in the sensed potential. Then, if a larger current is applied, $I_{inlarge}$, and an external field is applied, a change in resistance of the sensor 600 will occur thereby causing a change in the sensed potential. Because the sensor is constructed according to the present invention, the change in resistance of the sensor for a large input current is different than the change in resistance of the sensor for a small input current. Thus, the magnitude of the input current can be determined by sensing the change in potential across the sensor 606, i.e., the change in resistance of the sensor.

Figure 7A:
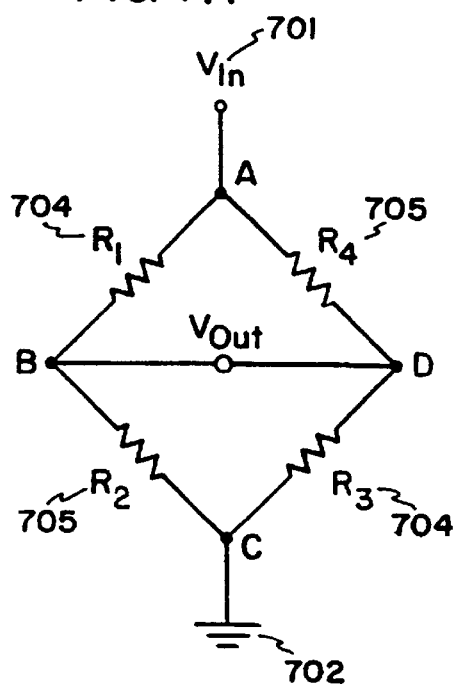
FIG. 7(a) is an electrical schematic of a bridge circuit utilizing the present invention.
Figure 7B:
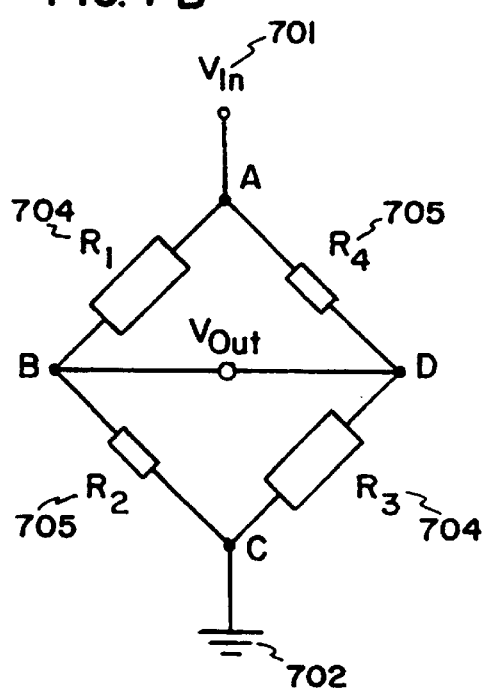
FIG. 7(b) is a physical schematic of the bridge circuit shown in FIG. 7(a) utilizing the present invention.

A bridge circuit, preferably a Wheatstone bridge circuit, in which giant magnetoresistive structures according to the present invention are used as resistors 704, 705 is shown in schematic form in FIGS. 7(a)–(b). A voltage in 701 and ground 702 is shown connected between two opposing nodes of the bridge at each of which two of the four GMR resistors are electrically connected as is well known.

More particularly, the bridge circuit has a four terminal electrical network (A, B, C, D). A first resister $R_1$ is connected between network terminals (A) and (B), a second resister $R_2$ is connected between network terminals (B) and (C), a third resistor $R_3$ is connected between the network terminals (C) and (D) and a fourth resister $R_4$ is connected between network terminals (A) and (D). The first and third resisters $R_1$ and $R_3$ preferably have the same current density when a field is applied across network terminals (A) and (C) and resistors $R_2$ and $R_4$ preferably have the same current density which is different from the current density of the first and third resistors $R_1$ and $R_3$.

The bridge can be used as a sensor to determine the magnitude of an applied external field. For example, a constant voltage is $V_{in}$ at terminal 701. An output $V_{out}$ is detected, and, at zero external field will equal zero. But if an external field is applied, the resistance of resistors $R_1$ and $R_3$ changes differently than the resistance of resistors $R_2$ and $R_4$ so that $V_{out}$ does not equal zero. By detecting the change in $V_{out}$, the magnitude of the external field can be determined.

Thus, to use the bridge as a sensor, the variation in resistance in an applied field of resistors $R_1$ and $R_3$ had to be different than the variation in resistance of resistors $R_2$ and $R_4$. In the past, using simple GMR structures, this was accomplished by shielding one set of the resistors. Another way that was used to accomplish this was to bias one set of resistors so that its transfer curve would be shifted so that, the resistance of those resistors would go either up or down. One way to accomplish this bias is to use an external field. This, of course, had the disadvantage of requiring additional power and circuit complexity to shift the resistors transfer curves.

The GMR structure according to the present invention is used and the first set of resistors $R_1$ and $R_3$ is patterned differently from the second set of resistors $R_2$ and $R_4$. More particularly, the width of resistors $R_1$ and $R_3$ is made wider so that the current density through resistors $R_1$ and $R_3$ is lower than the current density through $R_2$ and $R_4$ since current density is inversely proportional to width. FIG. 7(b) illustrates the physical configuration of a Wheatstone bridge circuit according to the present invention. Preferably, the ratio of widths of $R_1$, $R_3$ to $R_2$, $R_4$ ranges from about 2:1 to about 20:1.

Experiment

The stacks schematically illustrated in FIG. 1(a) and FIG. 3(a) were deposited in an S-gun sputter deposition system. The NiFeCo layers were co-sputtered from NiFe and CoFe targets; all other layers were deposited from single targets. Prior to deposition, photoresist was patterned and the devices were defined using a liftoff process.

Quad layer GMR films consisting of a total of four magnetic layers; two simple ferromagnetic layers and two synthetic antiferromagnet layers, were deposited and patterned into devices (FIG. 3(a)). The synthetic antiferromagnet layers are in the form of a trilayer structure of two ferromagnetic layers separated by a spacer. In a preferred embodiment, the outer layers 330, 337, i.e., the layers facing away from the center of the stack, were designed to be thicker than the inner layers 332, 335, so that a high enough sense field would produce the highest resistance state for the stack as a whole, with antiparallel magnetization orientation of the magnetic layers across all three spacer interfaces 333, 304, 334. Upon application of an external magnetic field down the length of the stripe, resistance decreases to an intermediate resistance state.

It was found that the device formed according to the present invention behaved differently depending on the magnitude of the bias current applied. More particularly, if a low bias current is applied, a low zero field bias state, i.e. when no external field is present, is achieved. The resistance of the structure increases as the strength of the external field increases. If a large bias current is applied, a high zero field bias state is achieved. The resistance of the structure decreases as the strength of the external field increases. A simple GMR sensor such as that shown in FIG. 1(a) always has a high zero field bias state no matter what bias current is applied.

Transfer curve data were taken for approximately 6 $\mu$m wide devices patterned from both the Quad layer GMR (FIG. 3(a)) and simple GMR (FIG. 1(a)) structures with a fixed bias current applied down a strip line. The material easy axis was oriented across the stripe, and the external field was applied down the length of the stripe to saturate the devices. Data for the Quad layer structure FIG. 3(a) is shown in FIGS. 4(a)–(b). Depending upon the current density through the device, the zero field bias state of the patterned resistors is either low or high. A low current density results in the low bias state and resistance increases as the applied field increases. In order to achieve a low resistance, zero field bias state, presumably several of the ferromagnetic layers are aligned essentially parallel to one another across the Cu spacers. A small amount of parallel or "orange peel" coupling across the Cu spacers is typical for sandwich structures with Cu in this thickness range. As current through the device is increased, the field generated overcomes the weak parallel coupling. At a high enough current density, the device is biased high at zero field, and resistance decreases with applied field strength.

The data indicate that the Quad layer GMR material (FIG. 3(a)) could be used for current sensing, as well as magnetic field sensing, applications. In addition to the flexibility of the zero-field bias state, another advantage of the Quad layer GMR structure (FIG. 3(a)) is that devices may be operated with relatively low current density as compared to simple GMR sandwich films (FIG. 1(a)). FIG. 4(a) shows data for a resistor patterned from the Quad layer GMR sandwich material (FIG. 3(a)) that exhibits about a 1.7% GMR signal with 1 mA of bias current A resistor with the same linewidth patterned from the more conventional GMR sandwich stack (FIG. 1(a)), shown in FIG. 5(a), exhibits only about 0.3% GMR tested under the same conditions.

The above specification, examples and data provide a complete description of the manufacture and use of the composition of the invention. Since many embodiments of the invention can be made without departing from the spirit and scope of the invention, the invention resides in the claims hereinafter appended.

I claim:

1. A magnetoresistive sensor, comprising:
    a substrate;
    a first trilayer disposed on the substrate;
    a first spacer layer disposed on the first trilayer;
    a first magnetic layer disposed on the first spacer layer,
    a second spacer layer disposed on the first magnetic layer;
    a second magnetic layer disposed on the second spacer layer;
    a third spacer layer disposed on the second magnetic layer;
    a second trilayer disposed on the third spacer layer; and
    a cap layer disposed on the second trilayer;
    wherein, the first and second trilayer comprises:
        a first ferromagnetic layer;
        a second ferromagnetic layer; and
        an anti-parallel coupling layer disposed between and in contact with the first and second ferromagnetic layers.

2. The sensor of claim 1, wherein the second spacer layer is a nonmagnetic layer.

3. The sensor of claim 1, further comprising a buffer layer disposed on the substrate and in contact with the first trilayer.

4. The sensor of claim 3, wherein the buffer layer comprises a material selected from the group consisting of Ta, Zr, Ni—Fe, and $Al_2O_3$ and mixtures thereof.

5. The sensor of claim 3, wherein the buffer layer has a thickness of about 20 to about 80 Angstroms.

6. The sensor of claim 1, wherein the second ferromagnetic layer is thicker than the first ferromagnetic layer.

7. The sensor of claim 1, wherein the first and second ferromagnetic layers comprise a material selected from the group consisting of Ni, Fe, Co and mixtures thereof.

8. The sensor of claim 1, wherein the first and second ferromagnetic layers have a thickness of about 10 to about 100 Angstroms.

9. The sensor of claim 1, wherein the anti-parallel coupling layer comprises a material selected from the group consisting of Ru, Ir, Rh and mixtures thereof.

10. The sensor of claim 1, wherein the anti-parallel coupling layer has a thickness of about 3 to about 12 Angstroms.

11. The sensor of claim 1, wherein the first spacer layer comprises a material selected from the group consisting of Cu, Au, Ag and mixtures thereof.

12. The sensor of claim 1, wherein the first spacer layer has a thickness of about 25 to about 45 Angstroms.

13. The sensor of claim 1, wherein the first and second magnetic layers comprise a material selected from the group consisting of Ni, Fe, Co and mixtures thereof.

14. The sensor of claim 1, wherein the first and second magnetic layers have a thickness of 10 to about 100 Angstroms.

15. The sensor of claim 1, wherein the nonmagnetic spacer comprises a material selected from the group consisting of Cu, Au, Ag and mixtures thereof.

16. The sensor of claim 1, wherein the nonmagnetic spacer has a thickness of about 25 to about 45 Angstroms.

17. The sensor of claim 1, wherein second spacer layer comprises a material selected from the group consisting of Cu, Au, Ag and mixtures thereof.

18. The sensor of claim 1, wherein the second spacer layer has a thickness of about 25 to about 45 Angstroms.

19. The sensor of claim 1, wherein the cap layer comprises a material selected from the group consisting of Ta, $Al_2O_3$ and mixtures thereof.

20. The sensor of claim 1, wherein the cap layer has a thickness of about 20 to about 80 Angstroms.

21. A magnetoresistive sensor device, comprising:
    a substrate;
    a first trilayer disposed on the substrate;
    a first spacer layer disposed on the first trilayer;
    a first magnetic layer disposed on the first spacer layer;
    a second spacer layer disposed on the first magnetic layer;
    a second magnetic layer disposed on the second spacer layer;
    a third spacer layer disposed on the second magnetic layer;
    a second trilayer disposed on the third spacer layer; and
    a cap layer disposed on the second trilayer;
    wherein, the first and second trilayer comprises:
        a first ferromagnetic layer;
        a second ferromagnetic layer; and
        an anti-parallel coupling layer disposed between and in contact with
    the first and second ferromagnetic layers; and
    wherein, the resistance of the magnetoresistive sensor is dependent upon the magnitude of an applied bias current.

22. The sensor device of claim 21, wherein the second spacer layer is a nonmagnetic layer.

23. A bridge circuit, comprising:
    a first pair of magnetoresistive structures coupled to first opposite nodes of a Wheatstone bridge;
    a second pair of magnetoresistive structures coupled to second opposite nodes of the Wheatstone bridge;
    wherein the first pair of magnetoresistive structures has a greater current density than the second pair of magnetoresistive structures when an external field is applied to the Wheatstone bridge.

24. The bridge circuit of claim 23, wherein the first pair of magnetoresistive structures is larger than the second pair of magnetoresistive structures.

25. The circuit of claim 24, wherein the first pair of magnetoresistive structures to the second pair of magnetoresistive structures ranges has a width ratio from about 1:2 to about 1:20.

26. A disc drive system, comprising:
a magnetic recording disc;
a magnetoresitive sensor comprising:
  a substrate;
  a first trilayer disposed on the substrate;
  a first spacer layer disposed on the first trilayer;
  a first magnetic layer disposed on the first spacer layer;
  a second spacer layer disposed on the first magnetic layer;
  a second magnetic layer disposed on the second spacer layer;
  a third spacer layer disposed on the second magnetic layer;
  a second trilayer disposed on the third spacer layer; and
  a cap layer disposed on the second trilayer;
  wherein, the first and second trilayer comprises:
    a first ferromagnetic layer;
    a second ferromagnetic layer; and
    an anti-parallel coupling layer disposed between and in contact with the first and second ferromagnetic layers;
an actuator for moving the magnetoresitive sensor across the magnetic recording disc; and
a detection circuitry electrically coupled to the magnetoresitive sensor for detecting changes in resistance of the magnetoresitive sensor caused by rotation of the magnetization axes of the first and second laminate layers in response to magnetic fields from the magnetically recorded data.

27. The sensor device of claim 26, wherein the second spacer layer is a nonmagnetic layer.

28. An apparatus for measuring an external field applied across a Wheatstone bridge, the apparatus comprising:
a four terminal electrical network (A, B, C, D) including a first resistor $R_1$ connected between network terminals (A) and (B), a second resistor $R_2$ connected between terminals (B) and (C), a third resistor $R_3$ connected between the network terminals (C) and (D) and a fourth resistor $R_4$ being connected across network terminals (A) and (D);

wherein resistors $R_1$ and $R_3$ have a first current density when a field is applied across network terminals (A) and (C) and the resistors $R_2$ and $R_4$ have a second current density when the same field is applied across network terminals (A) and (C) wherein the second current density is not equal to the first current density;

means operatively coupled across the network terminals (B) and (D) for detecting a potential across the terminals (B) and (D).

29. The apparatus of claim 28, wherein the first current density of resistors $R_1$ and $R_3$ increases as the field decreases and the second current density of resistors $R_2$ and $R_4$ decreases as the field increases.

30. The apparatus of claim 28, wherein the first, second, third and fourth resistors are magnoresistive sensors, comprising:
a substrate;
a first trilayer; disposed on the substrate;
a first spacer layer disposed on the first trilayer;
a first magnetic layer disposed on the first spacer layer;
a second spacer layer disposed on the first magnetic layer;
a second magnetic layer disposed on the second spacer layer;
a third spacer layer disposed on the second magnetic layer;
a second trilayer disposed on the third spacer layer; and
a cap layer disposed on the second trilayer;
wherein, the first and second trilayer comprises:
  a first ferromagnetic layer;
  a second ferromagnetic layer; and
  an anti-parallel coupling layer disposed between and in contact with the first and second ferromagnetic layers.

* * * * *